US011451146B2

(12) United States Patent
Wakasugi (10) Patent No.: US 11,451,146 B2
(45) Date of Patent: Sep. 20, 2022

(54) DC-DC CONVERTER

(71) Applicants:Kabushiki Kaisha Toshiba, Tokyo (JP); Toshiba Electronic Devices & Storage Corporation, Tokyo (JP)

(72) Inventor: Kenichi Wakasugi, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 268 days.

(21) Appl. No.: 16/801,824

(22) Filed: Feb. 26, 2020

(65) Prior Publication Data

US 2021/0067038 A1 Mar. 4, 2021

(30) Foreign Application Priority Data

Sep. 3, 2019 (JP) .............................. JP2019-160567

(51) Int. Cl.
*H02M 3/158* (2006.01)
*H03F 3/45* (2006.01)
*H02M 1/00* (2006.01)

(52) U.S. Cl.
CPC ........ *H02M 3/158* (2013.01); *H03F 3/45273* (2013.01); *H02M 1/0025* (2021.05)

(58) Field of Classification Search
CPC .... H02M 1/0025; H02M 1/0032; H02M 1/14; H02M 1/36; H02M 1/44; H02M 3/158; H03F 2200/351; H03F 2203/30111; H03F 2203/30078; H03F 3/217; H03F 3/3022; H03F 3/45192; H03F 3/45273; H03F 3/45748; Y02B 70/10
See application file for complete search history.

(56) References Cited

U.S. PATENT DOCUMENTS

| | | | |
|---|---|---|---|
| 7,443,234 B2 * | 10/2008 | Iriguchi | H03F 3/45179 330/253 |
| 7,777,459 B2 | 8/2010 | Williams | |
| 7,782,027 B2 | 8/2010 | Williams | |
| 7,786,712 B2 | 8/2010 | Williams | |
| 7,812,579 B2 | 10/2010 | Williams | |

(Continued)

FOREIGN PATENT DOCUMENTS

| | | | |
|---|---|---|---|
| JP | 4858877 B2 | 1/2012 | |
| JP | 6757685 B2 | 7/2015 | |

(Continued)

*Primary Examiner* — Matthew V Nguyen
(74) *Attorney, Agent, or Firm* — Allen & Overy LLP (57) ABSTRACT

A DC-DC converter according to an embodiment is a DC-DC converter for generating an output voltage VOUT according to a reference voltage VREF, and includes a fully differential amplifier that outputs a first differential output signal and a second differential output signal according to a differential input using the reference voltage VREF and the output voltage VOUT, a pulse width modulation signal generation circuit that generates a pulse width modulation signal based on the first differential output signal Vout1 and the second differential output signal Vout2, and a driver that outputs a driving signal obtained by waveform-shaping the pulse width modulation signal.

8 Claims, 6 Drawing Sheets

(56) References Cited

U.S. PATENT DOCUMENTS

| | | |
|---|---|---|
| 7,893,678 B2 | 2/2011 | Blanken |
| 7,977,927 B2 | 7/2011 | Williams |
| 8,436,598 B2 * | 5/2013 | Miyamae .............. H02M 3/158 |
| | | 323/282 |
| 9,337,729 B2 | 5/2016 | Kokatsu |
| 10,069,418 B2 | 9/2018 | Wakasugi |
| 10,075,073 B2 * | 9/2018 | Guan ........................ G05F 1/46 |
| 10,097,175 B2 | 10/2018 | Wakasugi |
| 10,135,332 B2 | 11/2018 | Tanifuji |
| 2016/0359463 A1 * | 12/2016 | Kurose ............... H03M 1/1245 |
| 2018/0091050 A1 * | 3/2018 | Wakasugi ................ H03K 7/06 |
| 2018/0183430 A1 * | 6/2018 | Wakasugi ............. H02M 3/135 |
| 2018/0307259 A1 * | 10/2018 | Ogura .................... G05F 1/468 |
| 2019/0044505 A1 * | 2/2019 | Yabuzaki ........... H03K 19/0175 |

FOREIGN PATENT DOCUMENTS

| | | |
|---|---|---|
| JP | 2017-055578 A | 3/2017 |
| JP | 6145038 B2 | 6/2017 |
| JP | 2018-050421 A | 3/2018 |
| JP | 2018-157739 A | 10/2018 |
| JP | 6606057 B2 | 11/2019 |
| WO | 2006-035369 A2 | 4/2006 |

\* cited by examiner

DC-DC CONVERTER

CROSS-REFERENCE TO RELATED APPLICATION

This application is based upon and claims the benefit of priority from the prior Japanese Patent Application No. 2019-160567 filed in Japan on Sep. 3, 2019; the entire contents of which are incorporated herein by reference.

FIELD

Embodiments described herein relate generally to a DC-DC converter.

BACKGROUND

For a power management topology of a DC-DC converter, for example, a voltage mode control scheme, a current mode control scheme, and a ripple control scheme are used. Further, higher noise immunity, DC offset cancellation, etc., are required for the DC-DC converter.

However, in a conventional DC-DC converter, it is necessary to install a circuit for resolving problems such as the DC offset cancellation and the noise immunity, and therefore a circuit scale is enlarged.

DETAILED DESCRIPTION

A DC-DC converter according to an embodiment is a DC-DC converter for generating an output voltage according to a reference voltage and includes a fully differential amplifier that outputs a first differential output signal and a second differential output signal according to a differential input using the reference voltage and the output voltage, a pulse width modulation signal generation circuit that generates a pulse width modulation signal based on the first differential output signal and the second differential output signal, and a driver that outputs a driving signal obtained by waveform-shaping the pulse width modulation signal.

Hereinafter, embodiments will be described with reference to the accompanying drawings.

First Embodiment (Configuration)

Figure 1:
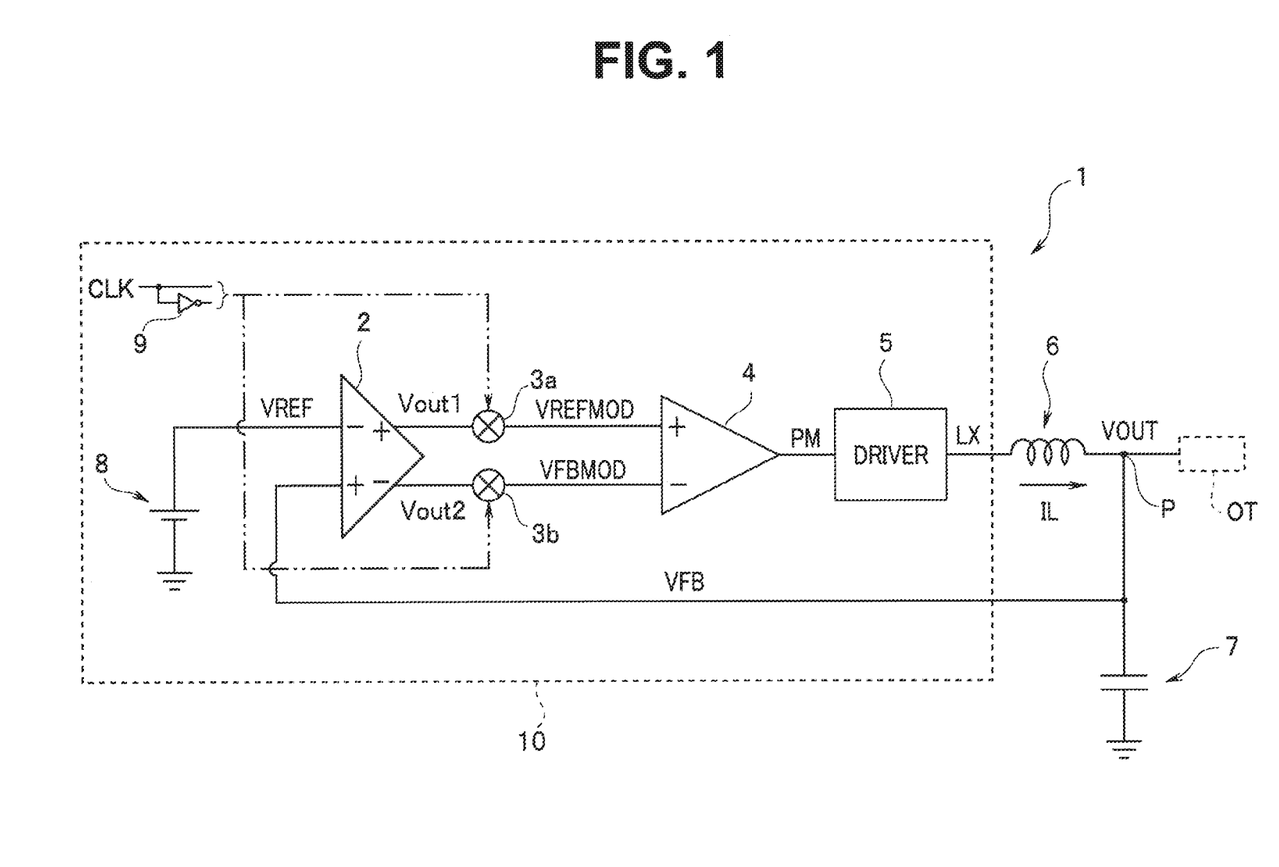
FIG. 1 is a circuit diagram of a DC-DC converter according to a first embodiment.

FIG. 1 is a circuit diagram of a DC-DC converter according to the present embodiment. The DC-DC converter 1 includes a fully differential amplifier 2, modulators 3a and 3b, a comparator 4, a driver 5, an inductor 6, a capacitor 7, and a reference voltage 8. The fully differential amplifier 2, the modulators 3a and 3b, the comparator 4, the driver 5, and the reference voltage 8 are included in a semiconductor chip, that is, a semiconductor apparatus 10 shown in a dotted line. Here, the inductor 6 and the capacitor 7 are not formed in the semiconductor apparatus.

An output of the driver 5 is connected to one end of the inductor 6. An output voltage VOUT is generated in a connecting point P between the other end of the inductor 6 and one end of the capacitor 7. The other end of the capacitor 7 is grounded. The connecting point P is electrically connected to an output terminal OT connected to a load circuit (not shown). The DC-DC converter 1 generates the output voltage VOUT according to a reference voltage VREF.

The fully differential amplifier 2 is an amplifier of two inputs and two outputs. The reference voltage VREF from the reference voltage 8 is input to an inverting input terminal of the fully differential amplifier 2. A feedback voltage VFB that is a voltage of the connecting point P is input to a non-inverting input terminal of the fully differential amplifier 2.

The fully differential amplifier 2 outputs a first differential output signal Vout1 to a first differential output terminal (+) that is a non-inverting output terminal. The fully differential amplifier 2 outputs a second differential output signal Vout2 to the second differential output terminal (−) that is an inverting output terminal. The first differential output signal Vout1 is supplied to the modulator 3a. The second differential output signal Vout2 is supplied to the modulator 3b. A voltage difference between the first differential output signal Vout1 and the second differential output signal Vout2 is a differential output of the fully differential amplifier 2. Specifically, the fully differential amplifier 2 outputs a differential output according to a differential input between the reference voltage VREF and the feedback voltage VFB of the output voltage VOUT to the first differential output terminal and the second differential output terminal.

The fully differential amplifier 2 outputs a voltage differential signal obtained by amplifying a voltage difference between two input terminals by a predetermined gain a to two output terminals. The fully differential amplifier 2 has a CMFB (common mode feedback) circuit and DC levels of the two output signals are constant.

A clock signal CLK from a clock generation circuit (not shown) and a clock signal CLK_X inverted by the inverter 9 are supplied to the modulators 3a and 3b.

The modulator 3a modulates the first differential output signal Vout1 in accordance with the clock signals CLK and CLK_X and outputs a modulation signal VREFMOD. The modulator 3b modulates the second differential output signal Vout2 in accordance with the clock signals CLK and CLK_X and outputs a modulation signal VFBMOD. Here, the modulation signals VREFMOD and VFBMOD are triangular waves. The modulation signal VFBMOD has a phase opposite to a phase of the modulation signal VREFMOD.

Specifically, the modulators 3a and 3b configure a modulation circuit having the modulator 3a that modulates the first differential output signal Vout1 and outputs the modulation signal VREFMOD and the modulator 3b that modulates the second differential output signal Vout2 and outputs the modulation signal VFBMOD. The modulation signal VREFMOD is input to a plus input terminal of the comparator 4. The modulation signal VFBMOD is input to a minus input terminal of the comparator 4.

Figure 2:
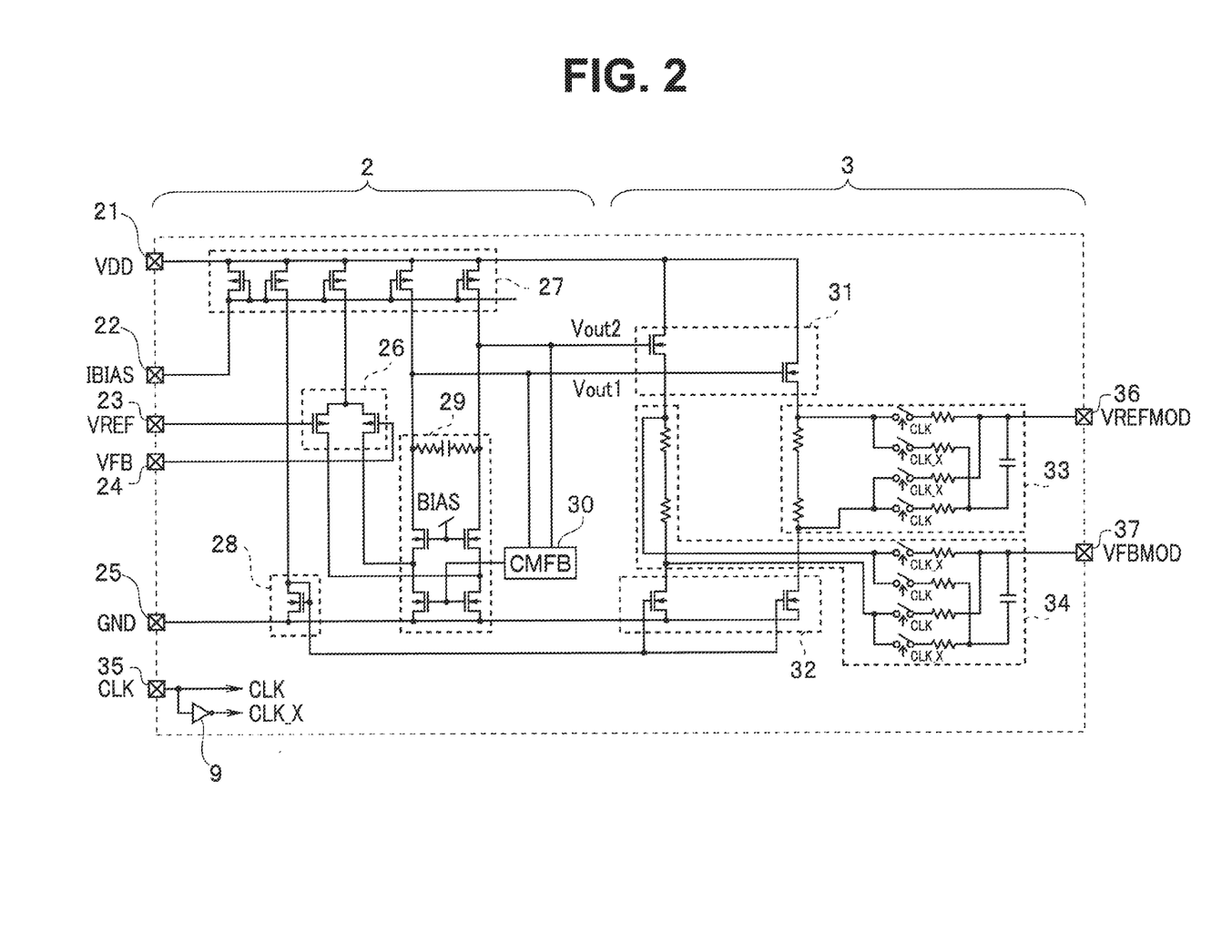
FIG. 2 is a circuit diagram of a fully differential amplifier and a modulation filter circuit according to the first embodiment.

FIG. 2 is a circuit diagram showing a configuration example of the fully differential amplifier 2 and a modulation filter circuit 3. The fully differential amplifier 2 has a power supply input terminal 21, a bias current input terminal 22, a reference voltage input terminal 23, a feedback voltage input terminal 24, and a ground input terminal 25.

The fully differential amplifier 2 has a differential amplifier 26, current mirror circuits 27 and 28, an output amplifier 29, and a common mode feedback circuit 30. The first differential output signal Vout1 and the second differential output signal Vout2 are symmetrical to each other with respect to a midpoint potential by the common mode feedback circuit 30.

The modulation filter circuit 3 has a source follower circuit 31, a current mirror circuit 32, and modulation filters 33 and 34. The modulation filters 33 and 34 correspond to the modulators 3a and 3b, respectively. Each of the modulation filters 33 and 34 has a plurality of switch circuits and is switched on and off in accordance with the clock signals CLK and CLK_X. The clock signal CLK is input to a clock input terminal 35 and the clock signal CLK_X is generated via the inverter 9. The modulation filter circuit 3 modulates the first differential output signal Vout1 and outputs the modulation signal VREFMOD to an output terminal 36. Further, the modulation filter circuit 3 modulates the second differential output signal Vout2 and outputs the modulation signal VFBMOD to an output terminal 37.

When the modulation signal VREFMOD becomes equal to or higher than the modulation signal VFBMOD, the comparator 4 shown in FIG. 1 outputs a HIGH signal. When the modulation signal VREFMOD becomes lower than the modulation signal VFBMOD, the comparator 4 outputs a LOW signal. As a result, the comparator 4 outputs a pulse width modulation (PWM) signal PM according to values of the modulation signal VREFMOD and the modulation signal VFBMOD to the driver 5.

Specifically, the modulators 3a and 3b and the comparator 4 configure a pulse width modulation signal generation circuit. The pulse width modulation signal generation circuit generates a PWM signal based on the first differential output signal Vout1 and the second differential output signal Vout2. The modulators 3a and 3b modulate the first differential output signal Vout1 and the second differential output signal Vout2 and output the modulation signal VREFMOD and the modulation signal VFBMOD, respectively. The comparator 4 outputs the PWM signal PM based on a result obtained by comparing the modulation signal VREFMOD with the modulation signal VFBMOD.

The driver 5 outputs a driving signal LX obtained by waveform-shaping the PWM signal PM. The driver 5 has, for example, a P-Channel MOSFET and an N-Channel MOSFET, and generates the driving signal LX based on the PWM signal PM and supplies the driving signal LX to the inductor 6. The driving signal LX is a pulse signal having a duty ratio the same as the duty ratio of the PWM signal PM. The driving signal LX is filtered by the inductor 6 and the capacitor 7 and is output to the output terminal OT as the output voltage VOUT.

(Action)

Next, operations of the DC-DC converter 1 shown in FIG. 1 will be described.

Figure 3:
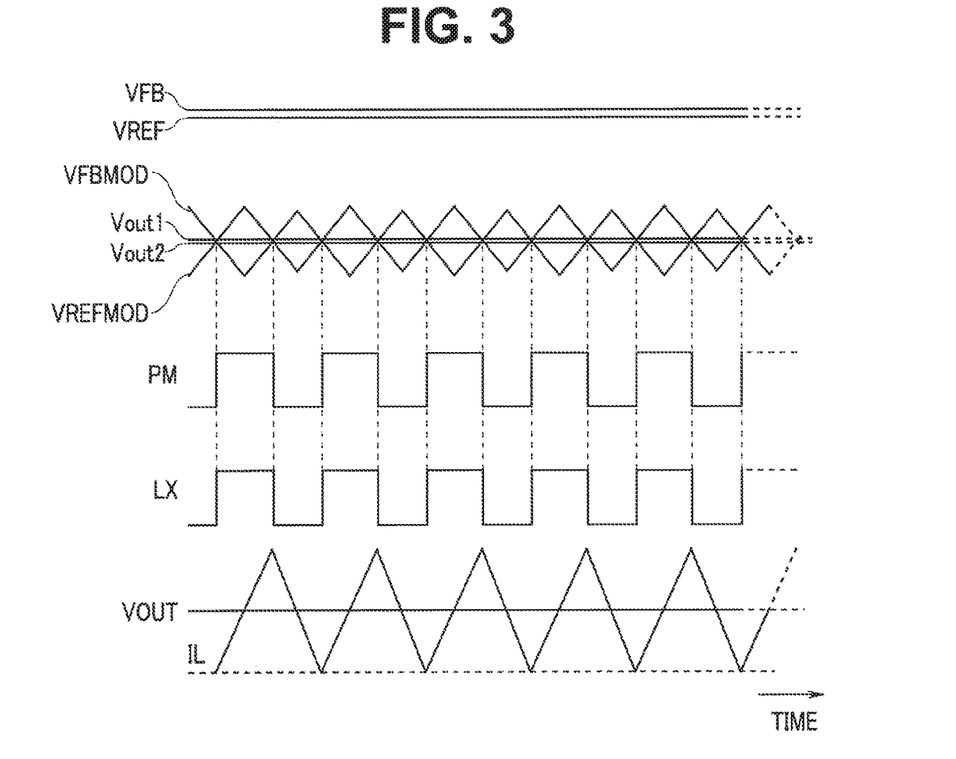
FIG. 3 is a timing chart of the DC-DC converter according to the first embodiment.

FIG. 3 is a timing chart of the DC-DC converter 1. The reference voltage VREF and the feedback voltage VFB are input to the fully differential amplifier 2, and the differential output signals Vout1 and Vout2 are output. A potential difference between the differential output signals Vout1 and Vout2 is equal to a value obtained by multiplying a potential difference between the reference voltage VREF and the feedback voltage VFB by the predetermined gain.

The first differential output signal Vout1 is converted into the modulation signal VREFMOD by the modulator 3a and the second differential output signal Vout2 is converted into the modulation signal VFBMOD by the modulator 3b. The modulation signal VREFMOD is a triangular wave signal and the modulation signal VFBMOD is a triangular wave signal having a phase opposite to the phase of the modulation signal VREFMOD.

The comparator 4 generates the PWM signal PM according to the modulation signals VFBMOD and VREFMOD and outputs the PWM signal PM to the driver 5. When the modulation signal VREFMOD becomes equal to or higher than the modulation signal VFBMOD, the PWM signal PM becomes a HIGH signal. When the modulation signal VREFMOD becomes lower than the modulation signal VFBMOD, the PWM signal PM becomes a LOW signal.

The driver 5 supplies the driving signal LX to one end of the inductor 6 based on the PWM signal PM. The output voltage VOUT is generated at the other end of the inductor 6.

Figure 4:
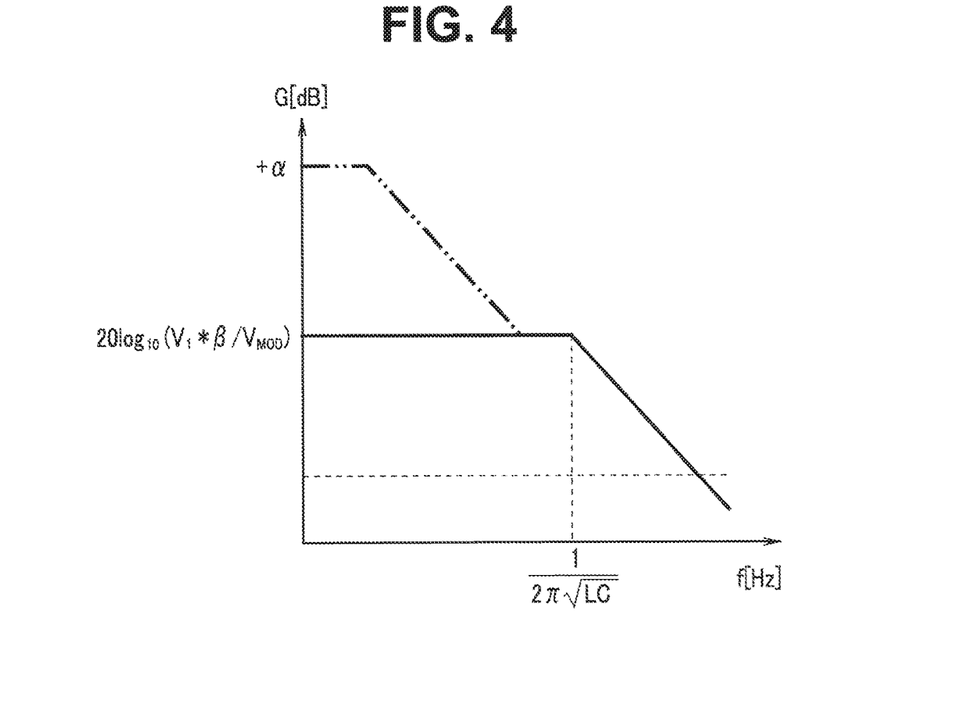
FIG. 4 is a bode plot of the DC-DC converter according to the first embodiment.

FIG. 4 is a bode plot of the DC-DC converter 1. A horizontal axis shows a frequency (f[Hz]) and a vertical axis shows a gain (G[dB]). In the case of a circuit in which signals obtained by modulating the reference voltage VREF and the feedback voltage VFB are compared by the comparator and a pulse signal is generated, a gain to a frequency is equal to 20 Log 10 (VI×β/VMOD) as shown in a solid line. VMOD represents a modulation amplitude and P represents a feedback factor of a feedback loop. When VI is equal to several volts and VMOD is equal to several tens of millivolts, a gain is 30 to 40 dB and a line regulation (fluctuation of the output voltage to fluctuation of the input DC voltage) is worsened.

On the other hand, in accordance with the DC-DC converter 1 according to the present embodiment, as shown in a chain double-dashed line in FIG. 4, a loop gain can be increased by using the gain a of the fully differential amplifier 2 to which the reference voltage VREF and the feedback voltage VFB are input, and therefore the line regulation can also be improved.

Figure 5:
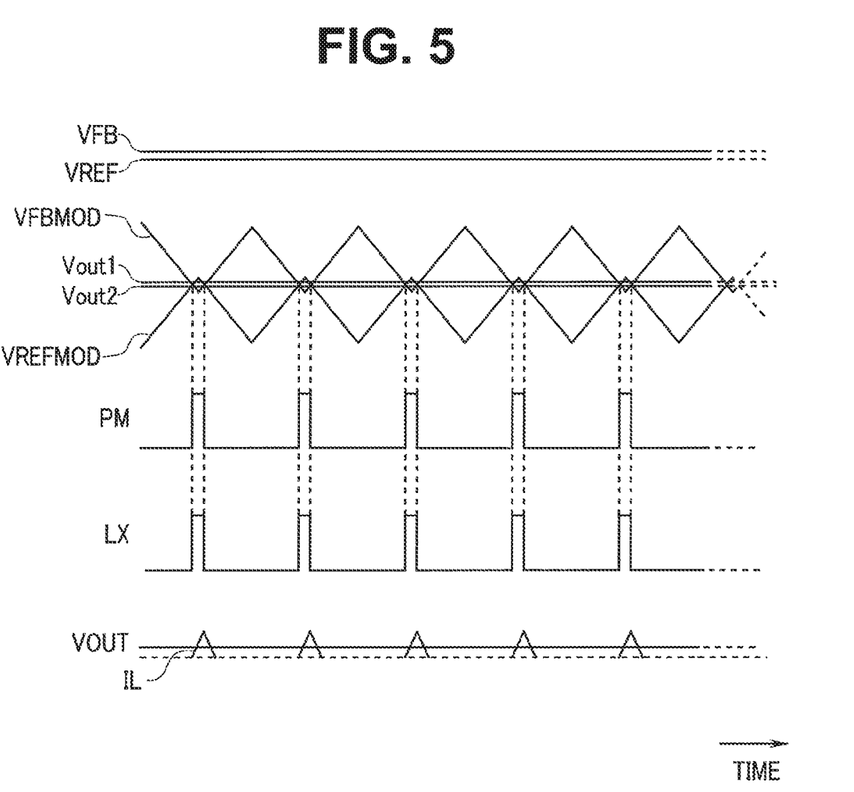
FIG. 5 is a timing chart of the DC-DC converter according to the first embodiment.

FIG. 5 is a timing chart of the DC-DC converter 1. FIG. 5 is a timing chart in a case in which a voltage difference between the reference voltage VREF and the feedback voltage VFB is small.

The fully differential amplifier 2 is used in the DC-DC converter 1 according to the present embodiment. Therefore, even if the voltage difference between the reference voltage VREF and the feedback voltage VFB is small, the voltage difference can be increased by using the gain a in the fully differential amplifier 2. Accordingly, as shown in FIG. 5, the PWM signal PM in which a period of a HIGH signal is short can be generated. In other words, a loop gain of the DC-DC converter is increased by using the gain a of the fully differential amplifier 2, and therefore a DC offset can be made small even if an additional circuit or the like is not provided.

Further, in the DC-DC converter 1, a soft start timing is provided and operations are guaranteed on start-up so that the output voltage is slowly raised from 0 V up to a setting voltage. Therefore, in each circuit of the DC-DC converter, the operation guarantee has to be performed over a broad input/output range. In the present embodiment, since the fully differential amplifier 2 is used, output ranges of the modulators 3a and 3b and an input range of the comparator 4 are narrowed.

Figure 6:
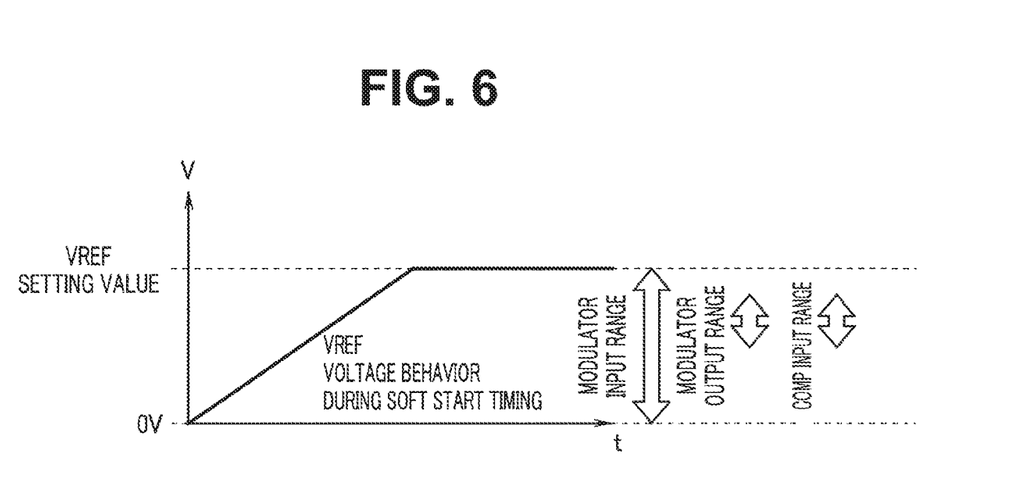
FIG. 6 is a diagram explaining an input/output range of each modulator and an input range of a comparator during a soft start timing of the DC-DC converter according to the first embodiment.

FIG. 6 is a diagram for explaining input/output ranges of the modulators 3a and 3b and the input range of the comparator 4 during a soft start timing. In the fully differential amplifier 2, a DC level of the output signal is kept constant by the CMFB (common mode feedback).

Therefore, when a dynamic range of the output signal in the fully differential amplifier 2 is determined, dynamic ranges of input/output signals of the modulators 3a and 3b and a dynamic range of an input signal of the comparator 4 are improved in the vicinity of the DC level of the output signal in the fully differential amplifier 2. Therefore, it is easy to ensure circuit characteristics during the soft start timing of the DC-DC converter 1. Particularly, when the fully differential amplifier 2 has a configuration in which, for example, a folded cascode operational amplifier is used, which is capable of an input signal of 0 V, a stable output is possible from an input of 0 V during the soft start timing and a stable operation can be assured.

As described above, according to the first embodiment, the DC-DC converter having high performance of a DC offset cancellation, noise immunity, and the like can be provided without increasing a circuit scale.

Second Embodiment

Figure 7:
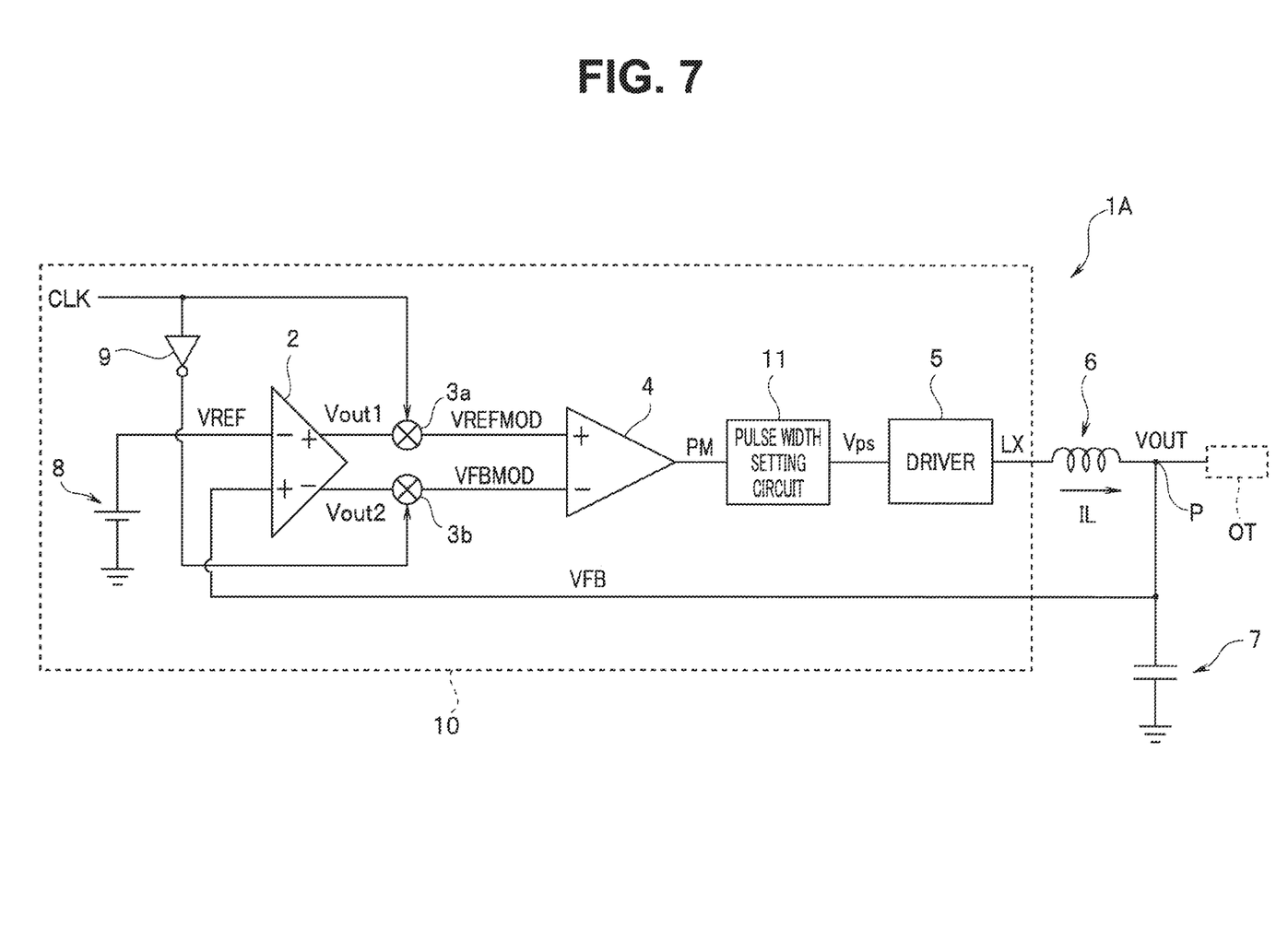
FIG. 7 is a circuit diagram of a DC-DC converter according to a second embodiment.

A DC-DC converter according to a second embodiment is a DC-DC converter in which an operation circuit during a light load is added to the circuit according to the first embodiment. A DC-DC converter 1A according to the second embodiment includes substantially the same configuration as the configuration of the DC-DC converter 1 according to the first embodiment. Therefore, the same components are denoted by the same reference numerals, and a description thereof is omitted, and only different components are described.

FIG. 7 is a circuit diagram of the DC-DC converter 1A according to the second embodiment. The DC-DC converter 1A includes a pulse width setting circuit 11 provided between the comparator 4 and the driver 5. The pulse width setting circuit 11 outputs, to the driver 5, a pulse width modulation (PWM) signal Vps generated so as to have a predetermined pulse width or more based on the PWM signal PM. The predetermined pulse width is a minimum pulse width in a light load operation and is previously determined, for example, based on an input/output voltage, an inductance value of an inductor L, a target efficiency or the like of the DC-DC converter 1A.

The pulse width setting circuit 11 is, for example, a circuit shown in FIG. 2 of Japanese Patent Application Laid-Open Publication No. 2018-50421. The pulse width setting circuit 11 has an AND circuit, a current detection amplifier, a reference voltage, a comparator, and a multiplexer. The current detection amplifier, the reference voltage, and the comparator configure a current detection circuit that detects that an inductor current IL is equal to or more than a predetermined peak current. The predetermined pulse width is set based on a detection result of the current detection circuit. Specifically, the pulse width setting circuit 11 sets the PWM signal PM to have the predetermined pulse width or more and outputs the PWM signal PM to the driver 5.

Figure 8:
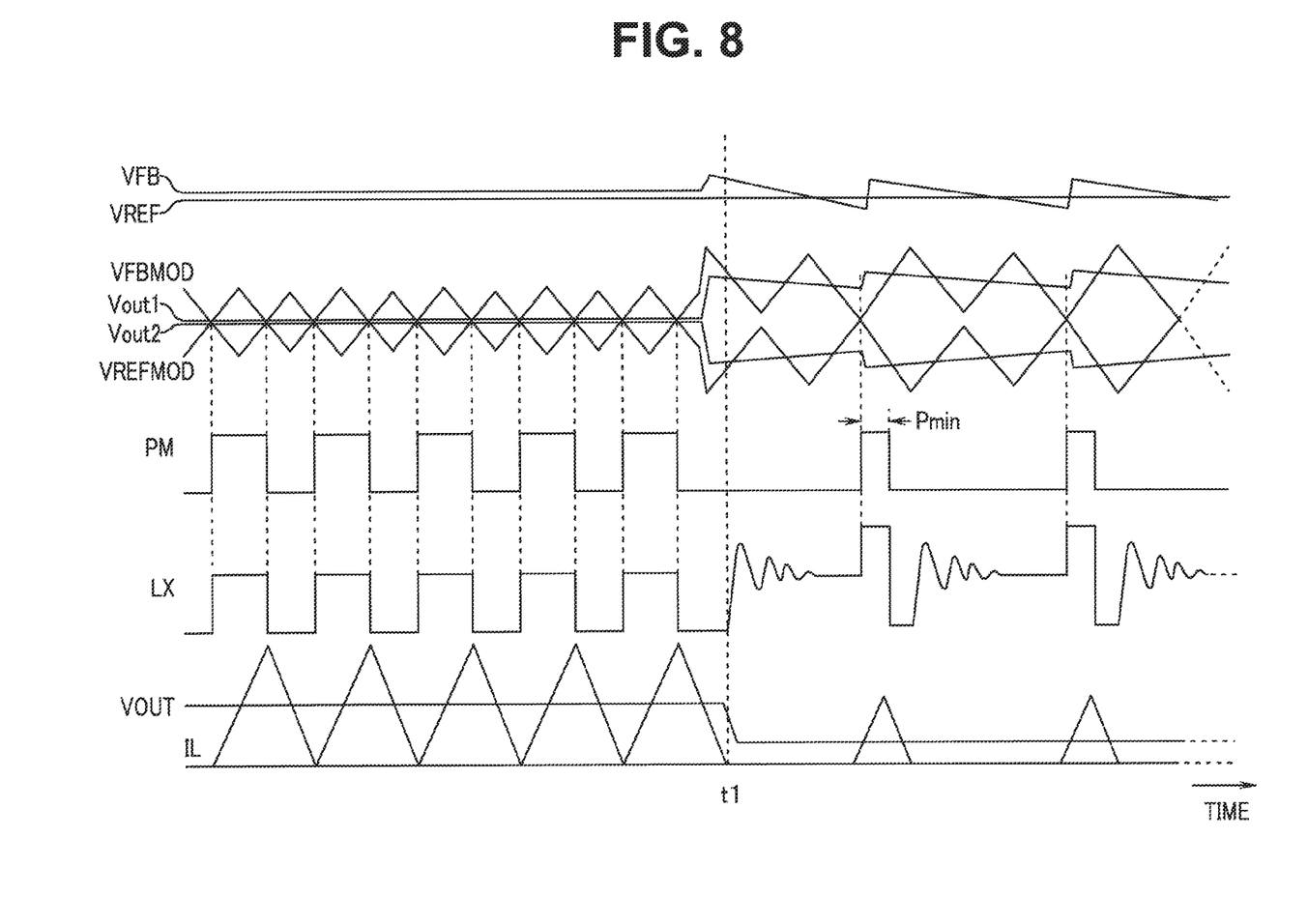
FIG. 8 is a timing chart of the DC-DC converter according to the second embodiment.

FIG. 8 is a timing chart of the DC-DC converter 1A. FIG. 8 shows waveforms of various signals in a case in which a load is light at a time t1 or later. When the load is light, waveforms of the differential output signals Vout1 and Vout2 are gently changed. While the modulation signals VREFMOD and VFBMOD intersect with each other, the PWM signal PM becomes low. However, the PWM signal PM is kept only in a predetermined pulse width Pmin by the pulse width setting circuit 11. As a result, an output of the driving signal LX is also kept constant.

In the DC-DC converter, an output voltage is generally kept high during the light load. According to the first embodiment, a differential signal between the reference voltage VREF and the feedback voltage VFB is compared to a differential signal amplified by the gain a of the fully differential amplifier 2 by using the comparator 4. Therefore, the output voltage of the DC-DC converter 1 can be highly accurately kept. According to the second embodiment, the DC-DC converter in which a power load efficiency during the light load is also improved can be provided in addition to effects according to the first embodiment.

As described above, according to each of the above-described embodiments, the DC-DC converter having high performance of a DC offset cancellation, noise immunity, and the like can be provided without increasing a circuit scale.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

What is claimed is:

1. A DC-DC converter for generating an output voltage according to a reference voltage, comprising:
    a fully differential amplifier that outputs a first differential output signal and a second differential output signal that are obtained by amplifying a voltage difference between the reference voltage and the output voltage by a predetermined gain using the reference voltage and the output voltage as a differential input;
    a pulse width modulation signal generation circuit that generates a pulse width modulation signal based on the first differential output signal and the second differential output signal; and
    a driver that outputs a driving signal obtained by waveform-shaping the pulse width modulation signal.

2. The DC-DC converter according to claim 1, wherein the pulse width modulation signal generation circuit includes:
    a modulation circuit that modulates the first differential output signal and the second differential output signal and outputs a first modulation signal and a second modulation signal, respectively, and
    a comparator that outputs the pulse width modulation signal based on a comparison result between the first modulation signal and the second modulation signal.

3. The DC-DC converter according to claim 2, wherein the modulation circuit includes
    a first modulator that modulates the first differential output signal and outputs the first modulation signal and
    a second modulator that modulates the second differential output signal and outputs the second modulation signal having a phase opposite to a phase of the first modulation signal.

4. The DC-DC converter according to claim 3, wherein the first modulation signal and the second modulation signal are triangular wave signals.

5. The DC-DC converter according to claim 2, further comprising a pulse width setting circuit that sets a pulse width of the pulse width modulation signal such that the pulse width is equal to or larger than a predetermined pulse width and outputs the pulse width modulation signal to the driver.

6. The DC-DC converter according to claim 2, wherein the comparator outputs a HIGH signal when a value of the first modulation signal is equal to or higher than a value of the second modulation signal, and outputs a LOW signal when a value of the first modulation signal is lower than a value of the second modulation signal, and thereby outputs the pulse width modulation signal.

7. The DC-DC converter according to claim 1, further comprising a pulse width setting circuit that sets a pulse width of the pulse width modulation signal such that the pulse width is equal to or larger than a predetermined pulse width and outputs the pulse width modulation signal to the driver.

8. The DC-DC converter according to claim 1, wherein the fully differential amplifier includes a common mode feedback circuit so that the first differential output signal and the second differential output signal are symmetrical to each other with respect to a midpoint potential.

* * * * *